United States Patent [19]

Koyama

[11] Patent Number: 5,089,875

[45] Date of Patent: Feb. 18, 1992

[54] SEMICONDUCTOR DEVICE WITH MIS CAPACITOR

[75] Inventor: Takeshi Koyama, Yokohama, Japan

[73] Assignee: Kabushiki Kaisha Toshiba, Kawasaki, Japan

[21] Appl. No.: 689,668

[22] Filed: Apr. 23, 1991

Related U.S. Application Data

[63] Continuation of Ser. No. 486,358, Feb. 28, 1990, abandoned.

Foreign Application Priority Data

Feb. 28, 1989 [JP] Japan .................................. 1-47221

[51] Int. Cl.$^5$ .................... H01L 27/02; H01L 29/90; H01L 29/92
[52] U.S. Cl. ........................................ 357/51; 357/13; 357/14; 357/20
[58] Field of Search .................. 357/51, 23.13, 13, 20, 357/14

[56] References Cited

U.S. PATENT DOCUMENTS 3,469,155  9/1969  Beek .................................. 357/23.13
4,651,178  3/1987  Avery .................................. 357/51
4,688,323  8/1987  Yoshida et al. ................... 357/23.13
4,758,873  7/1988  Monticelli ........................... 357/51

*Primary Examiner*—Andrew J. James
*Assistant Examiner*—Ngan Van Ngo
*Attorney, Agent, or Firm*—Banner, Birch, McKie & Beckett

[57] ABSTRACT

According to a semiconductor device with a MIS capacitor, an n+-type diffusion layer and an n⁻-type epitaxial layer are formed on a p-type semiconductor substrate. An n-type diffusion layer and a p-type well region are formed in the n⁻-type epitaxial layer. Emitter diffusion layers are formed in the well region with a predetermined distance from each other. An insulating film is formed on the resultant structure, excluding at least portions of the n-type diffusion layer and the emitter diffusion layers. Further, a metal-side electrode, a diffusion-region-side led-out electrode, and emitter electrodes are formed on the resultant structure. The metal-side electrode and the emitter electrode are connected by means of a metal wire, and the led-out electrode and the emitter electrode are connected by means of a metal wire.

8 Claims, 3 Drawing Sheets

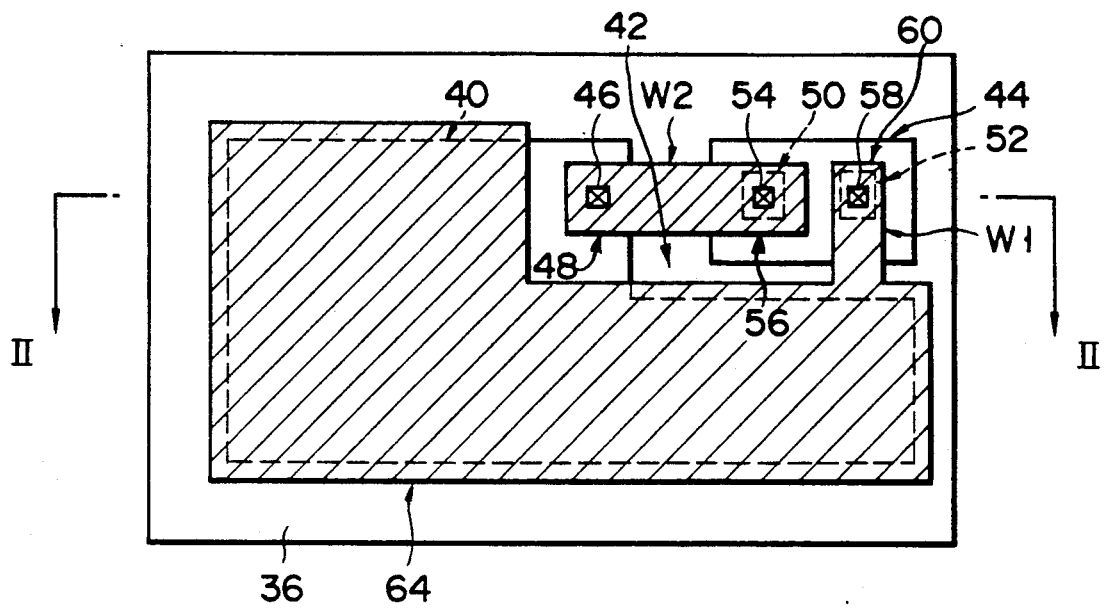
F I G. 3
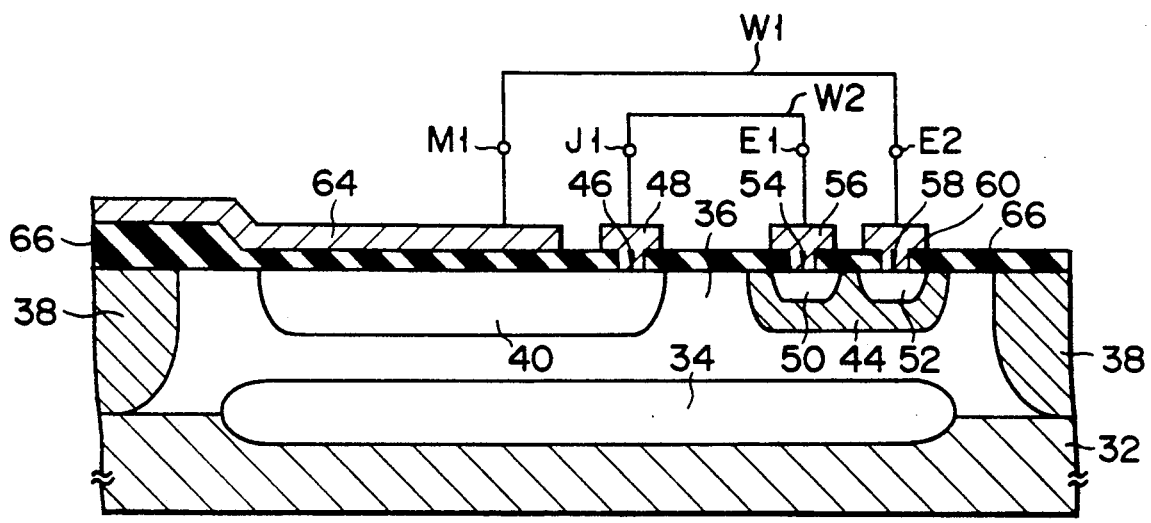
F I G. 4
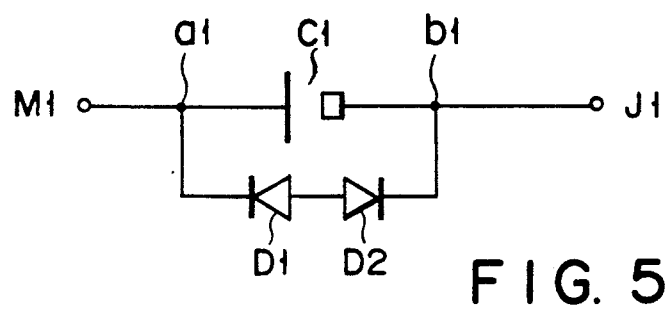
F I G. 5

SEMICONDUCTOR DEVICE WITH MIS CAPACITOR

This application is a continuation of application Ser. No. 07/486,358, filed Feb. 28, 1990 now abandoned.

BACKGROUND OF THE INVENTION

1. Field of the Invention

The present invention relates generally to a semiconductor device, and more particularly, to a semiconductor device with a MIS (Metal Insulator Semiconductor) capacitor.

2. Description of the Related Art

Conventionally, an MIS capacitor has been used in an electric device requiring large capacitance, such as an audio device.

FIG. 1 is a plane view showing a conventional MIS capacitor, and FIG. 2 is a cross-sectional view taken along line I—I in FIG. 1.

Referring to FIGS. 1 and 2, an $N^+$-type diffusion layer 14 is formed in a surface portion of a p-type semiconductor substrate 12. An $n^-$-type epitaxial layer 16 is formed on the $N^+$-type diffusion layer 14. The epitaxial layer 16 is formed in an insular shape in each MIS capacitor, which is separated by p-type diffusion layer 18 (inter-element isolation) reaching the substrate 12. An n-type diffusion layer 20 serving as a diffused-region-side electrode of the MIS capacitor is formed in the $n^-$-type epitaxial layer 16. The n-type diffusion layer 20 is connected to a diffused-region-side led-out electrode 24 through a contact hole 22. The led-out electrode 24 is connected to a terminal J.

An insulating layer (dielectric element 26 made of an oxide or a nitride is formed over the n-type diffusion layer 20. A metal-side electrode 28 of the MIS capacitor is formed on the insulating film 26. The electrode 28 is connected to a terminal M. The insulating film 26 interposed between the metal-side electrode 28 and the n-type diffusion layer 20 serves as a dielectric element of the MIS capacitor.

The insulating film 26 is sandwiched between the metal-side electrode 28 and the n-type electrode 20 (the diffused-region-side electrode), thereby forming the MIS capacitor. A notch 30 is formed in a predetermined location in the metal-side electrode 28. The led-out electrode 24 is formed in the notch 30. By virtue of the provision of the led-out electrode 24 in this manner, a predetermined semiconductor device can be formed in a given region with high efficiency.

In the above structure, the metal-side terminal M and the diffused-side terminal J ar simply connected to both end portions of the MIS capacitor. In this type of MIS capacitor, the thickness of the insulating (dielectric) film 26 is great, e.g. several-thousand Å. Because of this, a sufficient withstand voltage of the MIS capacitor is obtained. However, with a recent development of a MIS capacitor with high capacitance, it has become necessary to reduce the thickness of the insulating film 26 to about 500 Å. A MIS capacitor with a thin dielectric element has a low withstand voltage, e.g. 10 V to 50 V. Thus, if an abrupt high voltage, i.e. an external surge, is applied to either the metal-side electrode 28 or diffused-side led out electrode 24, an insulation between the metal side and the diffused side is easily broken by short-circuit.

In this case, a current path is formed in a region where the insulation has been broken, and the function of the capacitor is lost. It is difficult to expect when an external surge is applied to the capacitor. In some cases, the external surge is applied after the capacitor is built in a product or after the product is marketed. Thus, it is highly possible that defects are found in the product including a semiconductor device with such a MIS capacitor.

SUMMARY OF THE INVENTION

The object of the present invention is to provide a semiconductor device with a MIS (metal insulator semiconductor) capacitor, wherein the dielectric breakdown due to an external surge, which is incurred by the decrease in withstand voltage of the MIS capacitor, can be prevented.

According to one aspect of the present invention, there is provided a semiconductor device with a MIS capacitor, comprising: a semiconductor substrate of a first conductivity type; a diffusion layer of the first conductivity type, formed as a first region in the semiconductor substrate; a well region of a second conductivity type, formed as a second region in the semiconductor substrate., third and fourth regions of the first conductivity type, formed in the well region and separated at a predetermined distance from each other; an insulating film formed on at least a portion of the diffusion layer; and first and second wiring means for connecting the diffusion layer and the third region, and connecting the diffusion layer and the fourth region with the insulating film interposed therebetween.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 3 is a plane view showing a semiconductor device with a MIS capacitor according to a first embodiment of the present invention;

FIG. 4 is a cross sectional view taken along line II—II in FIG. 3;

FIG. 5 is a diagram showing an equivalent circuit of the first embodiment;

DETAILED DESCRIPTION OF THE PREFERRED EMBODIMENTS

Figure 2:
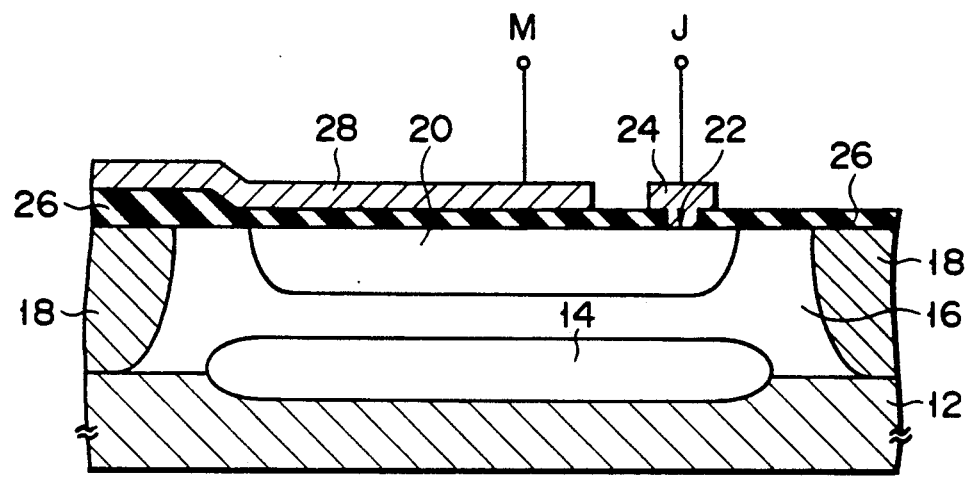
FIG. 2 is a cross-sectional view taken along line I—I in FIG. 1.
Figure 1:
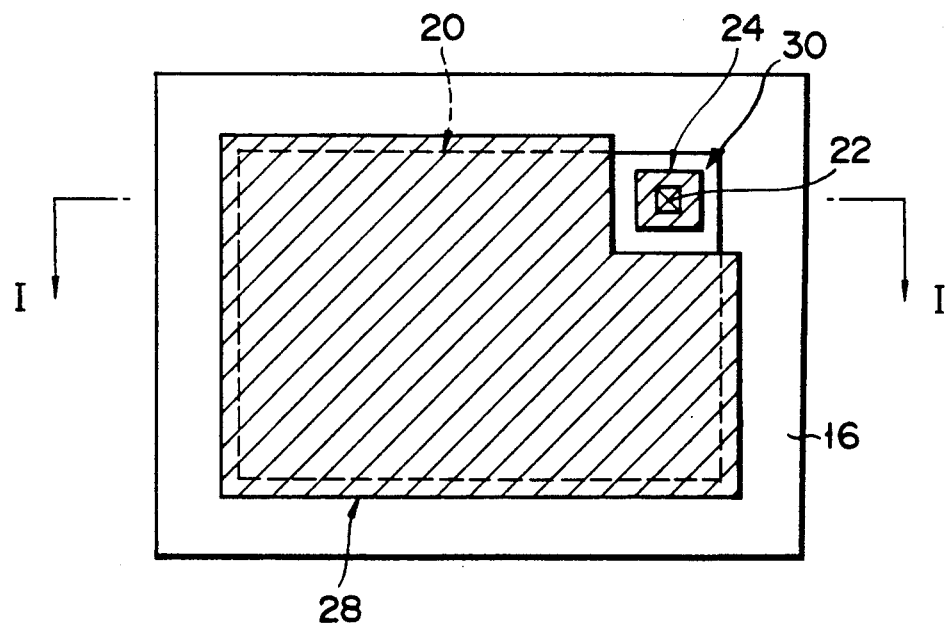
FIG. 1 is a plane view showing a conventional MIS capacitor.

Semiconductor devices with MIS capacitors according to embodiments of the present invention will now be described with reference to the accompanying drawings.

FIG. 3 is a plane view showing a semiconductor device with a MIS capacitor according to a first embodiment of the invention, and FIG. 4 is a cross-sectional view taken along line II—II in FIG. 3.

In FIGS. 3 and 4, N+-type diffusion layer 34 is formed in a surface portion of, for example, a p-type semiconductor substrate 32. An n⁻-type epitaxial layer 36 is formed over the diffusion layer 34. The epitaxial layer 36 is formed in an insular shape in each semiconductor device with a MIS capacitor, which is separated by p-type diffusion layer 38 (inter-element isolation) reaching the substrate 32. An n-type diffusion layer 40 serving as a diffused-region-side electrode of the MIS capacitor is formed in the n⁻-type epitaxial layer 36. A notch 42 is formed in the n-type diffusion layer 40, and a p-type well region (base diffusion layer) 44 is formed in the notch 42. The n⁻-type epitaxial layer 36 having the layer 40, notch 42 and well region 44 is formed in a rectangular or square shape and is separated by p-type diffusion layer 38, whereby a simple design of integrated circuits is realized. The n-type diffusion layer 40 is connected to a diffused-region-side led-out electrode 48 through a contact hole 46. The led-out electrode 48 is connected to a terminal J1.

Two emitter diffusion layers, i.e. a first n type emitter diffusion layer 50 and a second n-type emitter diffusion layer 52, are formed in the p-type well region (base diffusion layer) 44, which is formed in the n⁻-type epitaxial layer 36. The first n-type emitter diffusion layer 50 is connected to a first emitter electrode 56 through a contact hole 54, and the first emitter electrode 56 is connected to a terminal E1. On the other hand, the second n-type emitter diffusion layer 52 is connected to a second emitter electrode 60 through a contact hole 58, and the second emitter electrode 60 is connected to a terminal E2.

An insulating film 66 made of an oxide or a nitride is formed over the n⁻-type epitaxial layer 36 including the aforementioned diffusion layers. A metal-side electrode 64 is formed on the insulating film 66. A terminal M1 is connected to the metal-side electrode 64. The insulating film 66 is interposed between the metal-side electrode 64 and the n-type diffusion layer 40 and serves as a dielectric element of the MIS capacitor. In this structure, the n-type diffusion layer 40 and the n⁻-type epitaxial layer 36 serve as a common collector of a transistor with the first and second emitters 50 and 52.

The terminal M1 of the metal-side electrode 64 and the terminal E2 of the second emitter electrode 60 are connected by a metal wire W1, and similarly the terminal J1 of the diffusion-side led-out electrode 48 and the terminal E1 of the first emitter electrode 56 are connected by a metal wire W2. In other words, regarding the diffusion layers in the n⁻-type epitaxial layer 36, the n-type diffusion layer 40 (serving as a diffusion-side electrode of the MIS capacitor) and the first n-type emitter diffusion layer 50 are connected by the metal wire W2 through the contact holes 46 and 54. The first n-type emitter diffusion layer 50 and the second n-type emitter diffusion layer 52 form p-n junctions with the p-type well region 44 or the common base diffusion layer. The second emitter diffusion layer 52 is connected to the metal-side electrode 64 by the metal wire W1 through the contact hole 58. Accordingly, a transistor region with two emitters and one common base is formed between the metal-side electrode 64 and the n-type diffusion layer 40 or the diffusion-side electrode.

Suppose that an external surge is applied to, for example, the metal-side electrode 64 in the above-described semiconductor device. In this case, in accordance with the rise in potential of the metal-side electrode 64, the potential of the second emitter electrode 60 connected to the terminal E2, wire W1 and terminal M1 increases. The rise in potential of the second emitter electrode 60 increases the potential of the second n-type emitter diffusion layer 52 accordingly. The potential in the layer 52 exceeds a breakdown voltage level of an n-p reverse bias between the layer 52 and the p-type base diffusion layer 44, an electric current flows from the second n-type emitter diffusion layer 52 to the p-type base diffusion layer 44. The current flowing to the base diffusion layer 44 is allowed to enter the first n-type emitter diffusion layer 50 as a p-n forward bias current. Then, the current flows from the first n-type emitter diffusion layer 50 to the diffusion-side led-out electrode 48 through the first emitter electrode 56, terminal E1, wire W2 and terminal J1. The potential of the metal-side electrode 64 to which the external surge has been applied becomes equal to that of the n-type diffusion layer 40 or the diffusion-side electrode that is connected to the led-out electrode 48 and faces the metal-side electrode 64 with the insulating film 62 interposed therebetween. Thus, a dielectric breakdown of the capacitor can be prevented.

When an external surge is applied to the diffusion-side electrode 48, a current flows in a direction opposite to the direction mentioned above, and the potential of the electrode 48 becomes equal to that of the metal-side electrode 64. Thus, a dielectric breakdown of the capacitor can be prevented.

As described above, even if an abnormal external surge is applied to the metal-side electrode or the diffusion-side electrode, the surge is made to escape through a path connecting the first n-type emitter diffusion layer 50, p-type well region (base diffusion layer) 44 and second n-type emitter diffusion layer 52, or through a path connecting the second n-type emitter diffusion layer 52, p-type well region (base diffusion layer) 44 and first n-type emitter diffusion layer 50. Therefore, the MIS capacitor having a low withstand voltage due to a decrease in thickness of insulating film 62 can be protected.

The shape of the notch 42 is not limited to a rectangular or square one, as shown in FIG. 3. The notch 42 can have the most advantageous shape, from the viewpoint of design. A mask used in a photo-etching process for forming the diffusion layers is provided with only a pattern corresponding to a notch portion, and the pattern thereof is simple. Thus, miniaturization of the device is relatively easy.

Since the transistor region with the two emitters can be manufactured with minimum design rules, the loss in area of the MIS capacitor is very small. Rather, the thickness of the insulating film (dielectric element) of the capacitor can be decreased and the capacitance of the capacitor can be increased. As is well known, the capacitance of a capacitor is inversely proportional to the distance between the electrodes of the capacitor. Even if the thickness of the insulating layer of the capacitor is reduced and the withstand voltage is lowered owing to the increase in capacitance, the dielectric breakdown due to external surge can be prevented and the possibility of defective products on the market can be decreased.

As shown in FIG. 3, if the second emitter electrode 60 and the metal-side electrode 64 are integrally formed, the wire W1 is not needed and the number of manufacturing steps can be reduced. Also, if the led-out electrode 48 and the first emitter electrode 56 are integrally formed, the wire W2 is not needed and the number of manufacturing steps can be reduced. Consequently, the yield is increased, and the manufacturing cost is decreased. In addition, the contact resistance can be reduced.

An equivalent circuit of the first embodiment will now be described with reference to FIG. 5.

As shown in FIG. 5, a pair of diodes D1 and D2 are connected in series and in opposite polarities between nodes a1 and b1 on both sides of an MIS capacitor C1, that is, between the metal-side terminal M1 and the diffusion-side terminal J1. As seen from this equivalent circuit, when a surge is applied to either the metal-side terminal M1 (node a1) or the diffusion-terminal J1 (node b1), the diode D1 or D2 is broken down to allow the surge to escape. Thus, the dielectric breakdown of the MIS capacitor C1 can be prevented.

Next, a semiconductor device with a MIS capacitor according to a second embodiment of the invention will now be described with reference to FIGS. 6 and 7.

Figure 6:
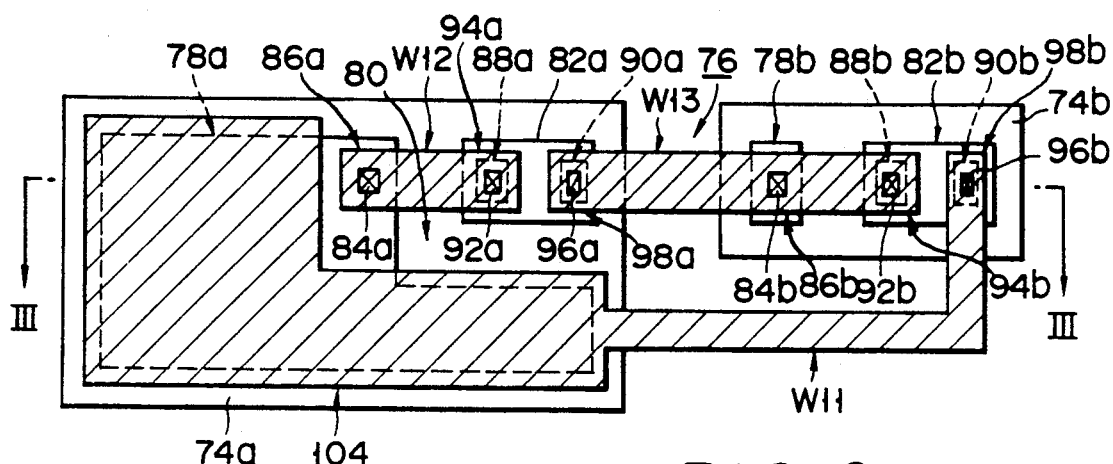
FIG. 6 is a plane view showing a semiconductor device with an MIS capacitor according to a second embodiment of the present invention.
Figure 7:
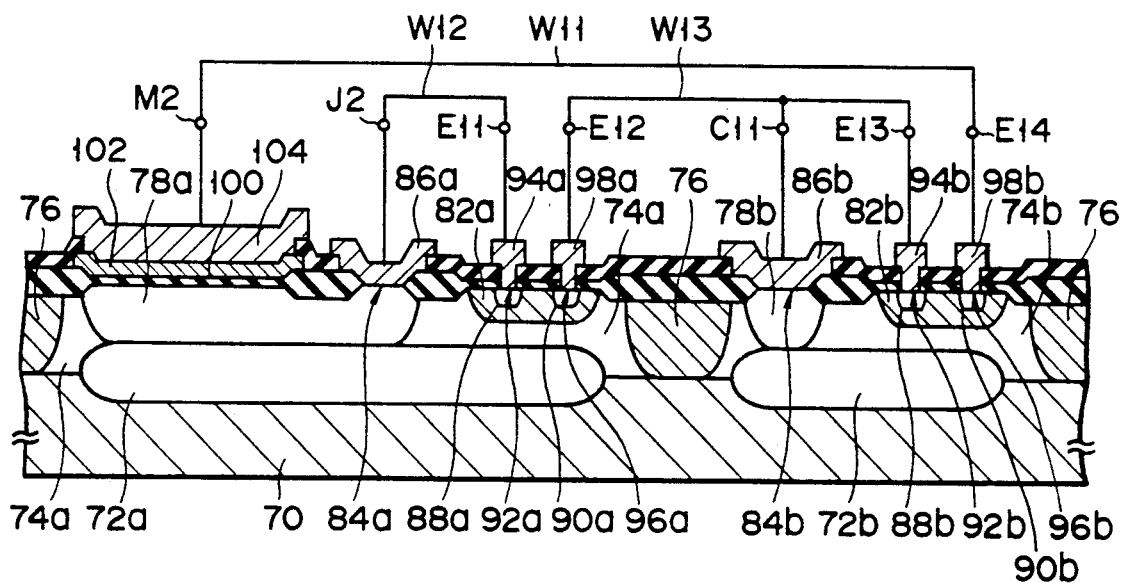
FIG. 7 is a cross-sectional view taken along line III—III in FIG. 6.

FIG. 6 is a plane view showing a semiconductor device with an MIS capacitor according to a second embodiment of the invention, and FIG. 7 is a cross-sectional view taken along line III—III in FIG. 6.

In FIGS. 6 and 7, $N^+$-type diffusion layers 72a and 72b are formed in a surface portion of, for example, a p-type semiconductor substrate 70. An $n^-$-type epitaxial layer 74a is formed on the diffusion layer 72a, and an $n^-$-type epitaxial layer 74b is formed on the diffusion layer 72b. The $n^-$-type epitaxial layers 74a and 74b are formed in the same epitaxial process, and are separated by p-type diffusion layers (inter-element isolation) 76 diffused down to the p-type semiconductor substrate 70.

An n-type diffusion layer 78a serving as a diffusion-side electrode of the MIS capacitor is formed in the epitaxial layer 74a. The n-type diffusion layer 78a has a notch 80. A p-type well region (first base diffusion layer) 82a of opposite conductivity type is formed in the notch 80. The $n^-$-type epitaxial layer 74a, including an MIS capacitor region, n-type diffusion layer 78a, notch 80 and p-type well region 82a, may be formed in a rectangular or square shape by means of the p-type diffusion layers 76, thereby realizing easy design of integrated circuits.

The n-type diffusion layer 78a is connected to a diffusion-side led-out electrode 86a through a contact hole 84a. The electrode 86a is connected to a terminal J2. The p-type well region 82a is formed in the $n^-$-type epitaxial layer 74a. Two emitter diffusion layers, i.e. a first n-type emitter diffusion layer 88a and a second n-type emitter diffusion layer 90a, are formed in the p-type well region 82a.

The first n-type emitter diffusion layer 88a is connected to a first emitter electrode 94a through a contact hole 92a, and the first emitter electrode 94a is connected to a terminal E11. On the other hand, the second n-type emitter diffusion layer 90a is connected to a second emitter electrode 98a through a contact hole 96a, and the second emitter electrode 98a is connected to a terminal E12.

In this second embodiment, the n-type diffusion layer 78a reaches the $N^+$-type diffusion layer 72a. Since the $n^-$-type epitaxial layer 74a is thin, the impurity of the n-type diffusion layer 78a reaches the $N^+$-type diffusion layer 72a in a short time period. An insulating film 100 made of an oxide or a nitride is formed over the epitaxial layer 74a. A metal-side electrode 104 of the MIS capacitor is formed over the insulating film 100 with a polysilicon layer 102 interposed therebetween. A terminal M2 is connected to the metal-side electrode 104. The insulating film 100 interposed between the metal-side electrode 104 and the n-type diffusion layer 78a serves as a dielectric element of the MIS capacitor. The n-type diffusion layer 78a and the $n^-$-type epitaxial layer 74a function as a common collector of a transistor having the first and second emitters 94a and 98a.

On the other hand, an n-type diffusion layer 78b serving as a collector of a transistor is formed in the epitaxial layer 74b. The n-type diffusion layer 78b is connected to a collector electrode 86b through a contact hole 84b. Further, a p-type well region (second base diffusion layer) 82b of opposite conductivity type is formed in the $n^-$-type epitaxial layer 74b. Two emitter diffusion layers, i.e. a third n-type emitter diffusion layer 88b and a fourth n-type emitter layer 90b, are formed in the p-type well region 82b.

The third n-type emitter diffusion layer 88b is connected to a third emitter electrode 94b through a contact hole 92b, and the third emitter electrode 94b is connected to a terminal E13. On the other hand, the fourth n-type emitter diffusion layer 90b is connected to a fourth emitter electrode 98b through a contact hole 96b, and the fourth emitter electrode 98b is connected to a terminal E14.

The terminal M2 of metal-side electrode 104 is connected to the terminal E14 of fourth emitter electrode 98b by means of a metal wire W11. The terminal J2 of diffusion-side led-out electrode 86a is connected to the terminal E11 of first emitter electrode 94a by means of a metal wire W12. The terminal E12 of second emitter electrode 98a, the terminal C11 of collector electrode 86b, and the terminal E13 of third emitter electrode 94b are connected to one another by means of a metal wire W13.

In the above structure, when an external surge is applied, for example, to the metal-side electrode 104, the potential of the fourth emitter electrode 98b, which is connected to the electrode 104 through the terminal M2, wire W11 and terminal E14, rises in accordance with the increase in potential of the electrode 104. The rise in potential of the fourth emitter electrode 98b increases the potential of the fourth n-type emitter diffusion layer 90b. When the potential of the diffusion layer 90b exceeds a breakdown voltage level of an n-p reverse bias between the fourth n-type emitter diffusion layer 90b and the second p-type base diffusion layer 82b, a current is allowed to flow from the fourth n-type emitter diffusion layer 90b to the second p-type base diffusion layer 82b. The current flowing to the base diffusion layer 82b is allowed to flow into the third n-type emitter diffusion layer 88b as a p-n forward bias current. Then, the current flows from the third n-type emitter diffusion layer 88b to the second emitter electrode 98a through the third emitter electrode 94b, terminal E13, wire W13 and terminal E12, and the potential of the second emitter electrode 98a is increased. Consequently, the potential of the second n-type emitter diffusion layer 90a rises, and when it exceeds a breakdown voltage level of an n-p reverse bias between the diffusion layer 90a and the first p-type base diffusion layer 82a, a current is allowed to flow from the second n-type emitter diffusion layer 90a to the first p-type base diffusion layer 82a, in the same manner as mentioned above. The current flowing to the base diffusion layer 82a is allowed to flow into the first n-type emitter diffusion layer 88a as a p-n forward bias current. Then, the current flows to the n-type diffusion layer 78a through the first emitter electrode 94a, terminal E11, wire W12, terminal J2 and diffusion side led-out electrode 86a. As a result, the potential of the metal-side electrode 104, to which the external surge has been applied, becomes equal to the potential of the n-type diffusion layer 78a which faces the metal-side electrode 104 with the insulating layer 100 interposed therebetween. Thus, the dielectric breakdown of the capacitor can be prevented. Similarly, when an external surge is applied to the diffusion-side led-out electrode 86a, the potential of the metal-side electrode 104 becomes equal to the potential of the n-type diffusion layer 78a by virtue of the current path in the direction opposite to the direction mentioned above. Thus, the dielectric breakdown of the capacitor can be prevented.

In this second embodiment, the $n^-$-type epitaxial layer 74a and the $n^-$-type epitaxial layer 74b are separated by the p-type diffusion layer 76. A pair of diodes connected in series and in opposite polarities are formed in the epitaxial layer 74a, and another pair of diodes connected in series and in opposite polarities are formed in the other epitaxial layer 74b.

As has been described above, two transistor regions each with two emitters and one common base are formed between the metal-side electrode 104 and the n-type diffusion layer 86a or the diffusion-side electrode. Since the two transistor regions can be manufactured with minimum design rules, the loss in area of the MIS capacitor is very small. Rather, the thickness of the insulating film (dielectric element) of the capacitor can be decreased and the capacitance of the capacitor can be increased. As is well known, the capacitance of a capacitor is inversely proportional to the distance between the electrodes of the capacitor. Even if the thickness of the insulating layer of the capacitor is reduced and the withstand voltage is lowered owing to the increase in capacitance, the dielectric breakdown due to external surge can be prevented and the possibility of defective products on the market can be decreased.

As shown in FIG. 6, if the metal-side electrode 104 and the fourth emitter electrode 98b are integrally formed, the wire W11 is not needed and the number of manufacturing steps can be reduced. If the led-out electrode 86b and the first emitter electrode 94a are integrally formed, the wire W12 is not needed and the number of manufacturing steps can be reduced. Also, if the third emitter electrode 94b, collector electrode 86b, and second emitter electrode 98a are integrally formed, the wire W13 is not needed and the number of manufacturing steps can be reduced. Consequently, the yield is increased, and the manufacturing cost is decreased. In addition, the contact resistance can be reduced.

An equivalent circuit of the second embodiment will now be described with reference to FIG. 8.

Figure 8:
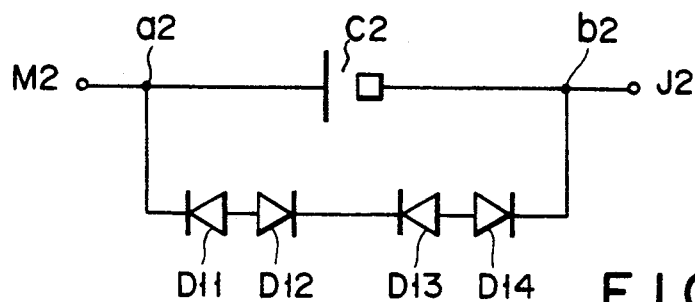
FIG. 8 is a diagram showing an equivalent circuit of the second embodiment.

As shown in FIG. 8, a pair of diodes D11 and D12 connected in series and in opposite polarities and a pair of diodes D13 and D14 connected in series and in opposite polarities are series-connected between nodes a2 and b2 on both sides of an MIS capacitor C2, that is, between the metal-side terminal M2 and the diffusion-side terminal J2. As in the first embodiment, when a surge is applied to either the metal-side terminal M2 (node a2) or the diffusion-side terminal J2 (node b2), the diode D11 and D13 or the diodes D12 and D14 are broken down to allow the surge to escape. Thus, the dielectric breakdown of the MIS capacitor C2 can be prevented. Also, the number of such pairs of diodes is changed in accordance with the power source voltage applied to the MIS capacitor, the breakdown voltage can be controlled. The second embodiment is suitable for the capacitor with a relatively high power source voltage.

In the second embodiment, if several pairs of diodes, each pair including diodes connected in opposite polarities with a common base and short-circuited emitter and collector of a transistor, are provided, the breakdown voltage can be controlled in accordance with the power source voltage applied to the MIS capacitor. For example, when the breakdown voltage of a pair of diodes connected in opposite polarities is 5 V, if two pairs are connected in series, the breakdown voltage is 5 V + 5 V = 10 V. Similarly, if three pairs are connected, the breakdown voltage becomes 15 V. For example, if three pairs of diodes are connected to set the breakdown voltage to 15 V, the diodes are not rendered conductive by the power source voltage is 10 V. Thus, the second embodiment is suitable for the capacitor with a relatively high power source voltage.

As stated above, if several pairs of diodes, each pair including diodes connected in opposite polarities, are connected between both ends of the MIS capacitor, the breakdown voltage of the diodes can be controlled in accordance with the power source voltage of the MIS capacitor. Also, even if an external surge is applied to the metal-side electrode or the diffusion-side electrode owing to some abnormal condition, the surge can be made to escape through the passage connecting the first n-type emitter diffusion layer 88a, first p-type base diffusion layer 82a, second n-type emitter diffusion layer 90a, third n-type emitter diffusion layer 88b, second p-type base diffusion layer 82b, and fourth n-type emitter diffusion layer 90b, or through the passage connecting these in the reverse order. The MIS capacitor with a low withstand voltage due to the reduction in thickness of the insulating film 100 can be protected.

The shape of the notch 80 is not limited to a rectangular or square one, as shown in FIG. 6. The notch 80 can have the most advantageous shape, from the viewpoint of design. A mask used in a photo-etching process for forming the diffusion layers is provided with only a pattern corresponding to a notch portion, and the pattern thereof is simple. Thus, miniaturization of the device is relatively easy.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A semiconductor device comprising:
   a semiconductor substrate a first conductivity type;

a diffusion layer of the first conductivity type formed in said semiconductor substrate;

a well region of a second conductivity type formed in said semiconductor substrate;

first and second regions of the first conductivity type formed in said well region;

an insulating film formed on at least a portion of said diffusion layer;

connecting means for connecting said diffusion layer and said first region; and an electrode connected to said second region and superposed on said diffusion layer with said insulating film disposed therebetwen, said electrode, said insulating film, and said diffusion layer comprising an MIS capacitor.

2. The semiconductor device according to claim 1, wherein said connecting means, said first region connected to said connecting means, said well region of the second conductivity type, said second region, and said electrode connected to the second region constitute at least one pair of diodes connected in series and in opposite polarities.

3. The semiconductor device according to claim 1, wherein said connecting means includes a diffusion-region-side led-out electrode on the side of said diffusion layer and a first emitter electrode on the side of said first region, and said electrode is connected to a second emitter electrode on the side of said second region.

4. The semiconductor device according to claim 3, wherein said electrode and said second emitter electrode are integral.

5. The semiconductor device according to claim 3, wherein said connecting means connects said diffusion-region-side led-out electrode and said first emitter electrode integrally.

6. The semiconductor device according to claim 1, wherein said MIS capacitor includes a notch portion at least in a portion thereof.

7. A semiconductor device comprising:

a semiconductor substrate of a first conductivity type;

a diffusion layer of the first conductivity type formed in said semiconductor substrate;

a well region of a second conductivity type formed in said semiconductor substrate;

first and second regions of the first conductivity type formed in said well region;

an insulating film formed on at least a portion of said diffusion layer;

a first pair of connected electrodes for connecting said diffusion layer and said first region; and a second pair of connected electrodes, first electrode of said second pair of connected electrodes connected to said second region and superposed on said diffusion layer with said insulating film disposed therebetween, said first electrode of said second pair of connected electrodes, said insulating film and said second region comprising an MIS capacitor.

8. A semiconductor device comprising:

a semiconductor substrate of a first conductivity type;

a diffusion layer of the first conductivity type formed in said semiconductor substrate;

at least one well region of a second conductivity type formed in said semiconductor substrate;

regions of the first conductivity type formed in said at least one well region;

an insulating film formed on at least a portion of said diffusion layer;

a first pair of connected electrodes, a first electrode of said first pair of connected electrodes connected to said diffusion layer and a second electrode of said first pair of connected electrodes connected to a first region of said regions of the first conductivity type; and a second pair of connected electrodes, a first electrode of said second pair of connected electrodes connected to a second region of said regions of the first conductivity type and a second electrode of said second pair of connected electrodes superposed on said diffusion layer with said insulating film disposed therebetween, said second electrode of said second pair of connected electrodes, said insulating film, and said diffusion layer comprising an MIS capacitor, wherein said first and second regions comprise regions of at least one pair of series-connected diodes formed in said semiconductor substrate and connected between said second electrode of said first pair of connected electrodes and said first electrode of said second pair of connected electrodes.

* * * * *